(12) United States Patent
Roohparvar et al.

(10) Patent No.: US 6,381,174 B1
(45) Date of Patent: Apr. 30, 2002

(54) NON-VOLATILE MEMORY DEVICE WITH REDUNDANT COLUMNS

(75) Inventors: Frankie F. Roohparvar, Milpitas; Al Vahidi-Mowlavi, San Jose, both of CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/804,561

(22) Filed: Mar. 12, 2001

(51) Int. Cl.[7] .............................................. G11C 16/00
(52) U.S. Cl. ............................ 365/185.09; 365/185.3; 365/185.22
(58) Field of Search .................. 365/185.22, 185.29, 365/185.3, 185.09, 200

(56) References Cited

U.S. PATENT DOCUMENTS

| | | | |
|---|---|---|---|
| 5,327,383 A | 7/1994 | Merchant et al. | 365/218 |
| 5,621,687 A * | 4/1997 | Doller | 365/185.29 |
| 5,671,178 A * | 9/1997 | Park et al. | 365/185.22 |
| 5,828,599 A | 10/1998 | Herdt | 365/185.08 |
| 5,910,916 A * | 6/1999 | Akaogi et al. | 365/185.29 |
| 6,034,891 A | 3/2000 | Norman | 365/185.09 |
| 6,077,211 A | 6/2000 | Vo | 365/225.7 |
| 6,134,143 A | 10/2000 | Norman | 365/185.09 |

\* cited by examiner

*Primary Examiner*—Tan T. Nguyen
(74) *Attorney, Agent, or Firm*—Fogg Slifer Polglaze Leffert & Jay, P.A.; Scott V. Lundberg

(57) ABSTRACT

A non-volatile memory device includes an array of erasable blocks of non-volatile memory cells. At least one of the blocks has at least one redundant column. A block register is associated with each erasable block. Each block register stores data that indicates when its associated erasable block is fully erased. A control circuit is used to perform an erase verification on each erasable block and provide data to the block registers based on an outcome of the erase verification. The control circuit performs the erase verification of the at least one redundant column in conjunction with the erasable block where the at least one redundant column resides.

32 Claims, 6 Drawing Sheets

NON-VOLATILE MEMORY DEVICE WITH REDUNDANT COLUMNS

TECHNICAL FIELD OF THE INVENTION

The present invention relates generally to non-volatile memories and in particular the present invention relates to erase operations in a non-volatile memory device.

BACKGROUND OF THE INVENTION

Memory devices are typically provided as internal storage areas in the computer. There are several different types of memory. One type of memory is random access memory (RAM) that is typically used as main memory in a computer environment. Most RAM is volatile, which means that it requires a steady flow of electricity to maintain its contents. Computers often contain a small amount of read-only memory (ROM) that holds instructions for starting up the computer. An EEPROM (electrically erasable programmable read-only memory) is a special type non-volatile ROM that can be erased by exposing it to an electrical charge. Like other types of ROM, EEPROM is traditionally not as fast as RAM. EEPROM comprise a large number of memory cells having electrically isolated gates (floating gates). Data is stored in the memory cells in the form of charge on the floating gates. Charge is transported to or removed from the floating gates by programming and erase operations, respectively.

Yet another type of non-volatile memory is a flash memory. A flash memory is a type of EEPROM that can be erased and reprogrammed in blocks instead of one byte at a time.

A typical flash memory comprises a memory array that includes a large number of memory cells arranged in a row and column fashion. Each memory cell includes a floating gate field-effect transistor capable of holding a charge. The cells are usually grouped into erasable blocks. Each of the memory cells can be electrically programmed in a random basis by charging the floating gate. The charge can be removed from the floating gate by an erase operation. Thus, the data in a cell is determined by the presence or absence of the charge in the floating gate.

To program a memory cell, a high positive voltage Vg is applied to the control gate of the cell. In addition, a moderate positive voltage is applied to the drain (Vd) and the source voltage (Vs) and the substrate voltage (Vsub) are at ground level. These conditions result in the inducement of hot electron injection in the channel region near the drain region of the memory cell. These high-energy electrons travel through the thin gate oxide towards the positive voltage present on the control gate and collect on the floating gate. The electrons remain on the floating gate and function to reduce the effective threshold voltage of the cell as compared to a cell that has not been programmed.

In flash memories, blocks of memory cells are erased as in groups. This is achieved by putting a negative voltage on the wordlines of an entire block and coupling the source connection of the entire block to Vcc (power supply), or higher. This creates a field that removes electrons from the floating gates of the memory elements. In an erased state, the memory cells can be activated using a lower control gate voltage.

A common problem with flash memory cells is over-erasure. A cell that is erased past a certain point becomes depleted and cannot be fully turned off. That is, too many electrons are removed from the floating gate, and the memory cell floating gate voltage becomes more positive than the threshold of the cell. The cell, therefore, cannot be turned off even if the control gate is at a ground potential. An over-erased memory cell can cause all memory cells coupled to the same column to be read as erased cells, even though they may be programmed.

In current flash memory cells, a pre-program cycle is performed on the block of memory cells prior to performing an erase cycle. As such, all the cells in a block are first programmed. The cells are then erased until all the cells are completely erased. A threshold voltage (Vt) distribution tightening operation is performed following the erase operation to recover memory cells that are over-erased. As flash memory devices increase in memory cell density, the time needed to perform a complete erase operation also increases.

In flash memories, a substantial part of the erase cycle time is spent on the erase cycle. Out of a typical 1-second erase operation; about one-half of the time is spent on pre-programming the memory cells, and the other half is used on the erase cycle. An erase pulse requires about 10 ms, while an erase verification operation requires less than 1 $\mu$s. With the density of flash memories increasing, the total time to verify all the locations is becoming a substantial part of the cycle. For instance, in a 64 Megabit flash device organized in 16 erasable blocks, there are 4 million locations that need to be verified during an erase operation. A typical 1 $\mu$s time for each verify cycle results in a verify time of 4 seconds. Further, memory cells are being verified for levels that are much tighter than their regular read levels. Thus, they need to be sensed much slower. For instance, a normal read is verifying that an erased cell has a threshold level (Vt) that is less than 4.5V. During erase verification, the memory verifies that the cell has a Vt that is less than 3V. This margin is smaller than prior memories and is more susceptible to noise.

Another common problem with flash memory devices is defects in the memory array that occur during manufacture of the array. Typical defects can include bad memory cells, open circuits, shorts between a pair of rows and shorts between a row and column. Defects can reduce the yield of the flash memory device. A way to resolve this problem, without discarding the memory device, is to incorporate redundant elements in the memory to selectively replace the defective elements. For example, redundant columns are a common form of redundant elements used in flash memory to replace defective primary columns (or defective cells coupled to the columns). The redundant columns are mapped to the defective columns by a redundant circuit. That is, a redundant circuit is used to selectively route address requests directed to a defective column to a redundant column. Redundant circuitry generally includes redundant registers used to store addresses of defective elements and a logic circuit used to compare address requests with addresses stored in the redundant registers. Typically, the redundant registers comprise electrical fuses, anti-fuses or non-volatile memory cells.

For the reasons stated above, and for other reasons stated below which will become apparent to those skilled in the art upon reading and understanding the present specification, there is a need in the art for a flash memory with an improved process for erasing and verifying a memory that incorporates redundant columns.

SUMMARY OF THE INVENTION

The above-mentioned problems with non-volatile memory devices and other problems are addressed by the present invention and will be understood by reading and studying the following specification.

In one embodiment, a non-volatile memory device includes an array of erasable blocks of non-volatile memory cells. At least one of the blocks has at least one redundant column. A block register is used for each erasable block to store data to indicate when the erasable block is fully erased. A control circuit performs an erase verification on each erasable block and provides data to an associated block register based on an outcome of the erase verification. The control circuit performs the erase verification of the at least one redundant column in conjunction with the erasable block where the at least one redundant column resides.

In another embodiment, a non-volatile flash memory device includes an array of non-volatile memory cells arranged in erasable blocks. Each erasable block comprises multiple sub-blocks. At least one of the sub-blocks includes a redundant column to selectively replace a defective column in one of the sub-blocks. A sub-block register is used for each sub-block to store a bit that indicates when the associated sub-block is either in an erased state or needs further erase. A state machine is used to control memory operations. The state machine performs individual erase verification operations on each sub-block including any redundant columns physically located in the sub-block. The state machine also provides the bit to the associated sub-block register based on the outcome of the erase verification operation.

In another embodiment a non-volatile flash memory device includes an array of non-volatile memory cells arranged in erasable blocks. Each erasable block comprises multiple sub-blocks. At least one of the sub-blocks has multiple redundant columns to selectively replace defective columns in the sub-blocks. A sub-block register is used for each sub-block to store data to indicate when the associated sub-block is in an erased state. A control circuit is used to control memory operations. The control circuit performs individual erase verification operations on each sub-block in conjunction with any redundant columns physically located in the sub-block. In addition, the control circuit provides the data to the sub-block register based on the outcome of the erase verification operation on an associated sub-block.

In another embodiment a non-volatile memory device includes an array of erasable blocks of non-volatile memory cells. At least one of the blocks has at least one redundant column. Block registers are associated with the erasable blocks. Each of the block registers store a bit that indicates when the erasable block is fully erased. Address registers are also associated with the erasable blocks. Each of the address registers stores a start verification address for its associated erasable block. Control circuitry to perform erase verification on each block and provide data to the block registers in response to an outcome of the erase verification on an associated block. The control circuit starts an erase verification on each block at a start verification address of an associated address register. The control circuitry also performs the erase verification of the at least one redundant column in conjunction with the block where the at least one redundant column resides.

In another embodiment, a non-volatile flash memory system includes a processor and a memory. The processor is used to provide an erase command. The memory is coupled to the processor. The memory includes an array, a redundant circuit and a control circuit. The array includes non-volatile memory cells arranged in erasable blocks. Each erasable block comprises a plurality of sub-blocks. At least one of the sub-blocks has at least one redundant column. Each sub-block has an associated sub-block register to store a bit that indicates when the sub-block is fully erased. The redundant circuit is used to redirect address requests from a defective column in a sub-block to the at least one redundant column. The control circuit is used to control erase operations in response to the erase command from the processor. The control circuit disables the redundant circuit from redirecting address requests from a defective column in the sub-block to the at least one redundant column during an erase verification of an erase operation. The control circuit further provides data to the sub-block register during an erase verification of a sub-block associated with the sub-block register.

A method of performing an erase verify operation on an erasable block of flash memory cells comprises verifying a state of each memory cell physically located in the block and ignoring a state of memory cells coupled to redundant columns mapped to the block but not physically located within the block.

A method of erase verify of an erasable sub-block of non-volatile memory cells comprises reading each memory cell in a primary sub-block of the sub-block of memory cells, reading each memory cell coupled to redundant columns physically located in the sub-block of memory cells, when all the memory cells are in an erased state, storing a bit in a sub-block register that indicates the sub-block is in an erased state, when a memory cell is read that is not in an erased state, storing the bit in a sub-block register that indicates the sub-block needs further erasure.

A method of operating a flash memory comprises applying an erase pulse to an array of non-volatile memory cells arranged in erasable sub-blocks having redundant columns, verifying each sub-block to determine if the memory cells located in each sub-block are in an erased state, wherein verification of each sub-block includes verification of memory cells coupled to redundant columns physically located in the sub-block and ignoring memory cells coupled to redundant columns mapped to the sub-block but located in another sub-block, storing data in sub-block registers associated with each sub-block, wherein the bit stored in the sub-block register indicates whether the memory cells in an associated sub-block are in an erased state, reading the bit in each sub-block register and applying further erase pulses to sub-blocks having a sub-block register with a bit that indicates the sub-block needs further erase.

A method of erasing a flash memory comprises performing a pre-program operation on a block of memory cells, applying an erase pulse to the block of memory cells, performing a first erase verification operation on a first sub-block of the block of memory cells and on redundant columns physically located in the first sub-block and terminating the erase verification of the first sub-block.

A method of performing an erase operation on a non-volatile memory comprises applying a first erase pulse to a block of memory cells, sequentially reading memory cells of a first sub-block of the block of memory cells, wherein the first sub-block includes memory cells coupled to redundant columns physically located in the first sub-block, ignoring memory cells coupled to redundant columns mapped to the first-sub block but not physically located in the first sub-block, storing an address of a first memory cell that is determined to be programmed in an address register, applying a second erase pulse to the first sub-block of memory cells and performing a second sequential reading of memory cells of the first sub-block starting at the first memory cell address.

DETAILED DESCRIPTION OF THE INVENTION

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Figure 1:
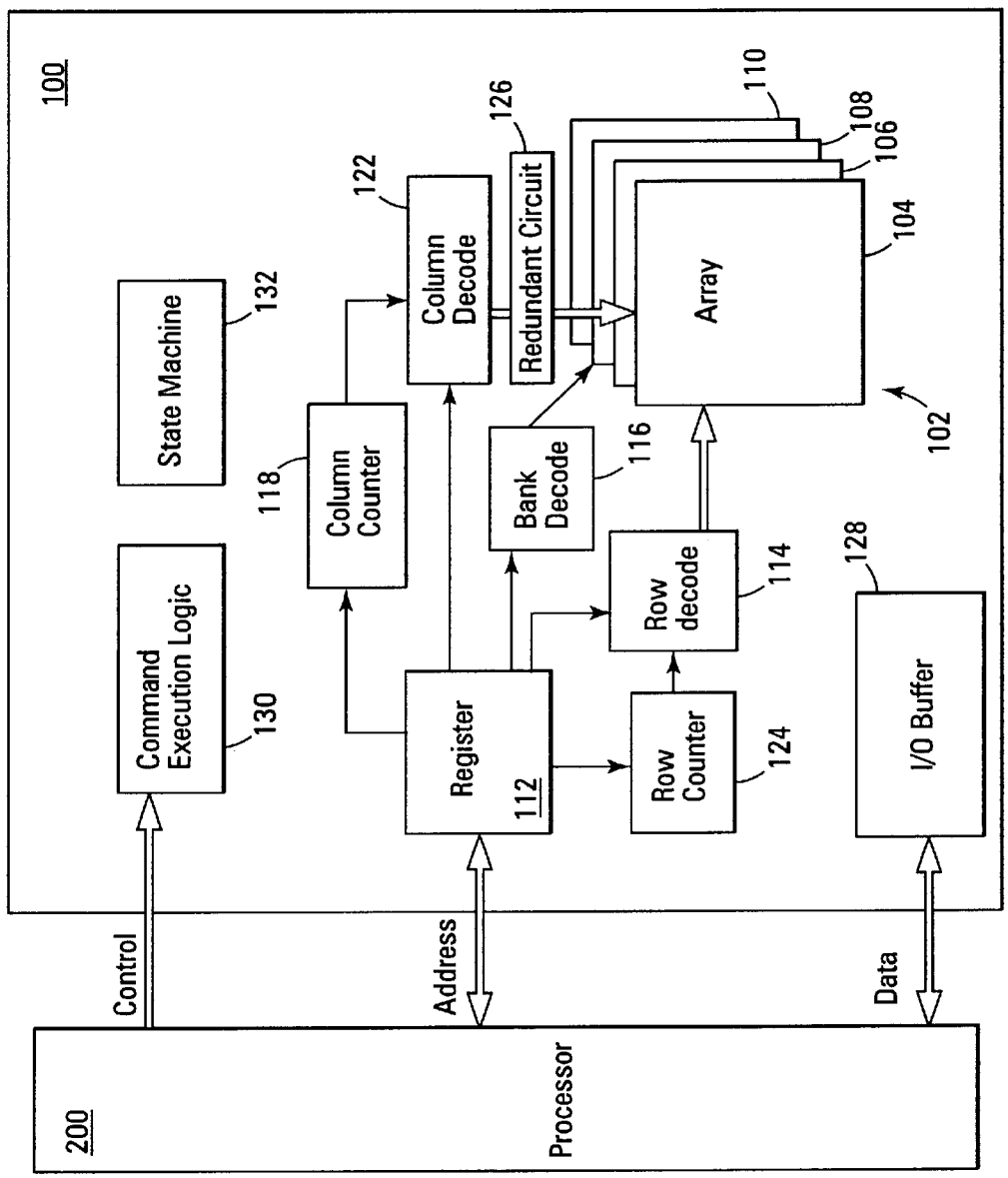
FIG. 1 is a block diagram of a memory device of an embodiment of the present invention.

Referring to FIG. 1, a block diagram of one embodiment of a synchronous flash memory of the present invention is described. The memory device 100 includes an array of non-volatile flash memory cells 102. The array is arranged in a plurality of addressable banks. In one embodiment, the memory contains four memory banks 104, 106, 108 and 110. Each memory bank contains addressable blocks of memory cells. The data stored in the memory can be accessed using externally provided location addresses received by address register 112 via address signal connections. The addresses are decoded using row decode circuitry 114. Row address counter 124 is also provided. The addresses are also decoded using bank decode logic 116. A redundant circuit 126 is provided to redirect column address requests from defective columns to redundant columns. To access an appropriate column of the memory, column address counter 118 couples addresses to column decode circuitry 122. Data is input and output through I/O circuit 128 via data connections. I/O circuit 128 includes data output registers, an output driver and an output buffer. Command execution logic 130 is provided to control the basic operations of the memory device. A state machine 132 is also provided to control specific operations performed on the memory array and cells. The command circuit 130 and/or state machine 132 can be generally referred to as control circuitry to control read, write, erase and other memory operations. The data connections are typically used for bidirectional data communication. The memory can be coupled to an external processor 200 for operation or testing.

The memory includes a pulse counter circuit to keep track of voltage pulses applied to the memory cells during erase and programming operations. The pulse counter is typically used to monitor a total number of pulses applied. In an embodiment of the present invention, the pulse counter is used in conjunction with a pulse register to improve erase operation performance, as explained below.

The memory cell array of a flash memory is typically arranged in erasable blocks. In one embodiment of the present invention, the erasable blocks are further arranged in sub-blocks. For example, a 16 Meg memory array can be arranged in four erasable blocks of 4 Meg where each of these blocks contains 16 sub-blocks.

During a typical prior art erase operation, an erase pulse, or series of erase pulses, is coupled to an addressed array block. Any redundant cells residing in the addressed array block receive the erase pulse or series of erase pulses with the block. The memory internal control, or state machine, then steps through each memory cell of the block to determine if data in the cells are erased (logical 1). The control circuitry stops verifying when it reaches a memory cell location that is not erased. The memory then applies another erase pulse to the block and begins another verification operation at the first memory cell location of the block. This process is repeated until all cells in the erasable block are verified as being in an erased state. A problem with this prior art erase/verify operation is that the slowest bit in the block dictates the level of erasure of all the memory cells in the block. Further, repeated erase pulses can over-erase a memory cell by removing too much charge from its floating gate. In an example memory, the fastest memory cell requires 5 erase pulses to fully erase the cell, typical memory cells require 10 pulses to erase, and the slowest memory cell in an erasable block requires 30 pulses to erase. With the prior art erase algorithm, the memory cells that are erased after 5 pulses are subjected to an extra 25 erase pulses that could potentially make them over-erased.

The present invention performs an erase operation on a block of memory cells uses a forward-looking scan algorithm. After applying an initial erase pulse to the memory block, the memory begins checking the memory cells in the block to determine if the cells are erased. As explained below, the memory may stop verification and scan the memory block when a predetermined number of erase pulses have been applied to the memory array.

Figure 2:
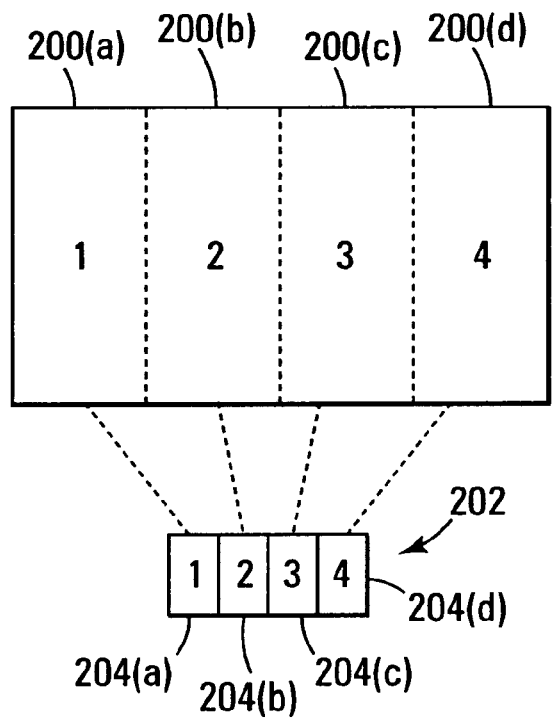
FIG. 2 illustrates sub-blocks of memory cells and corresponding sub-block registers.

Referring to FIG. 2, four sub-blocks 200(a)–(d) of a memory array block are illustrated. A block register or sub-block register 202 is provided in the memory that has bits 202(a)–(d), or storage locations, that correspond to each sub-block. As explained below, the register is used to indicate which sub-blocks are fully erased and which sub-blocks need additional erase operations. The register initially indicates that all of the sub-blocks need to be erased. When all memory cells of a sub-block have been determined to be erased, the corresponding register bit is changed to protect the sub-block from further erase pulses. The operation of the register is explained in greater detail below.

Figure 3:
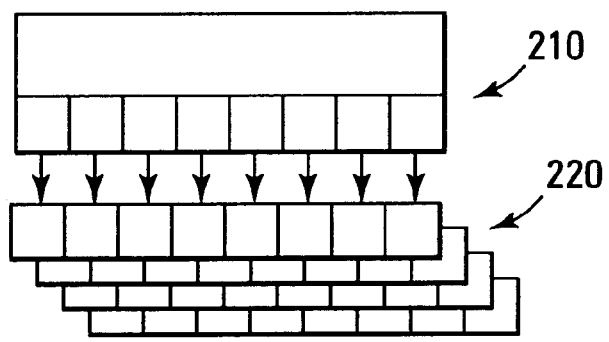
FIG. 3 illustrates an address counter and corresponding address register.

The present invention also contains an address verify register that is used to manage the erase verification operation. Referring to FIG. 3, an address counter 210 is coupled to a sub-block address verify register 220. The sub-block address register can store the contents of the address counter for each sub-block. That is, the sub-block address register is four-deep and each depth corresponds to one of the sub-blocks. In operation, the address verify register is used to store a memory cell address of the first memory cell in a memory sub-block that fails an erase verify test. The sub-blocks are sequentially tested to determine if all memory cells are erased. If a non-erased cell is detected, its address is stored in the sub-block register. This address is used in subsequent verification operations as a start address. As a result, previously verified memory cells are not re-verified.

Figure 4:
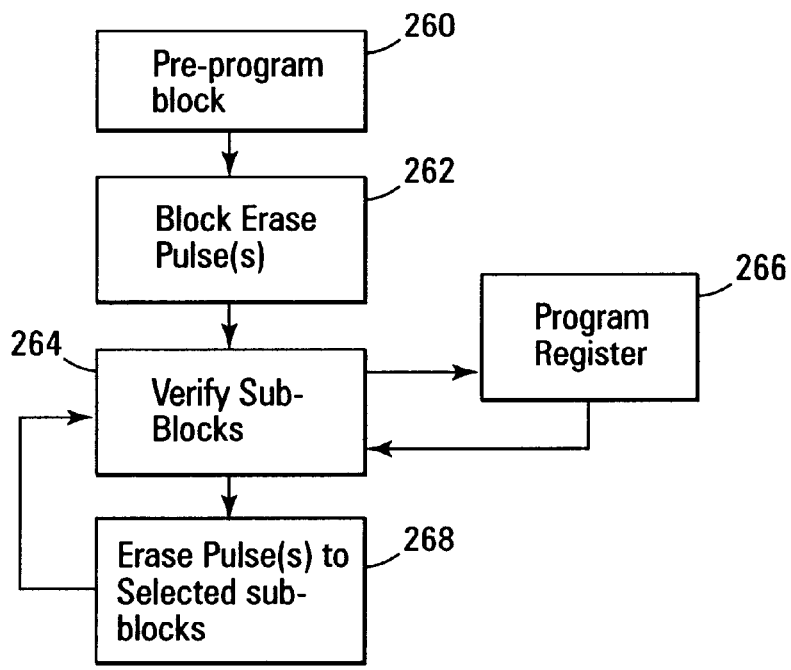
FIG. 4 is a flow chart of an erase operation.

FIG. 4 is a flow chart illustrating a portion of erase and verify operations of an embodiment of the present invention. An erase operation begins by pre-charging all of the memory cells in a block (260). This insures that all memory cells begin the erase operation with substantially the same floating gate charge. The memory block is then subjected to an erase pulse (262). As explained above, the erase pulse is used to remove charge from the memory cell floating gates. Care should be taken to avoid over-erasing a memory cell. That is, too much charge can be removed from the memory cell such that the memory cell conducts current even when its control gate is turned off.

After the initial erase pulses are applied, a verification of each sub-block is performed (264). The verification operation includes reading the memory cells of the sub-block to determine that the cells have been erased. Memory cells are considered erased if they have a floating gate charge (threshold voltage) that is below a predetermined level. When a programmed memory cell is located in a sub-block during the verification operation, the memory programs a register bit corresponding to the sub-block to a first state, such as logic 0 (266). It will be appreciated that the register may be pre-programmed to the first state and a subsequent program operation is not required. After locating a cell that is not erased, the memory jumps to the next sub-block of that erasable block. The memory verifies the next sub-block and if it finds all the cells in that block are erased, the corresponding location of the sub-block register is set to a second state (such as logic 1) indicating that the sub-block does not require any further erase pulses. The memory control then continues to verify all of the sub-blocks of the erasable block.

After all of the sub-blocks in an erase block have been verified, one or more additional erase pulses are applied to the sub-blocks that have a register bit indicating that all of the memory cells have not been erased (268). Additional verify operations are then performed on the sub-blocks that have a register bit programmed to the first state. That is, sub-blocks that do not contain programmed memory cells are not subjected to additional erase pulses. As such, the slowest cell to erase in a block only subjects a small sub-block of memory cells to possible over-erasure. The erase pulses and verification operations are repeated until all of the sub-blocks are fully erased, or a maximum number of erase pulses have been applied.

The threshold voltage (Vt) distribution of the memory cells of the present flash memory, relative to prior flash memory cells, is much tighter. Further, erasing non-volatile memory cells to a very negative threshold level and then bringing the threshold level back to a higher level using recovery methods is not good for memory cell reliability. The present invention provides for a better overall threshold distribution and improves both the reliability and performance of the erase operation. The above described erase/verify operation can reduce the time needed to perform an erase operation by using registers to identify a condition of the sub-blocks. The erase operation can be further improved by tracking a location of the programmed memory cells.

The present invention provides an address pointer for each of the sub-blocks of the memory array. The address pointers are used in conjunction with the memory address counter that is used to step throughout the memory array location. During the verification and scan operations, the memory advances through each memory location and checks for proper erasure. If the memory finds a location that is not erased, it copies the content of the address counter into the address pointer for that sub-block. Since there is at least one location in this sub-block that needs further erase pulses, there is no need to continue verifying or scanning that block. As such, the state machine issues a command to jump to the next sub-block. The memory then jumps to the next sub-block to continue the proper operation.

The contents of the address pointer for the next sub-block are copied to the address counter. The address pointer is initially set to a beginning address of its corresponding sub-block. The sub-block verification or scan continues until all the cells of the block have been checked by the erase verification operation. On subsequent checks of a sub-block, the memory begins at the location of the first programmed memory cell of the previous verification check. That is, the address pointer is copied to the address counter as the start location for each sub-block. When the full sub-block has been erased, the sub-block register can be set, as explained above, to indicate that further erase operations are not required. By re-starting the address location from the last programmed location and jumping to the next sub-block when a programmed cell has been detected within a sub-block, the present invention reduces overhead time.

Figure 5:
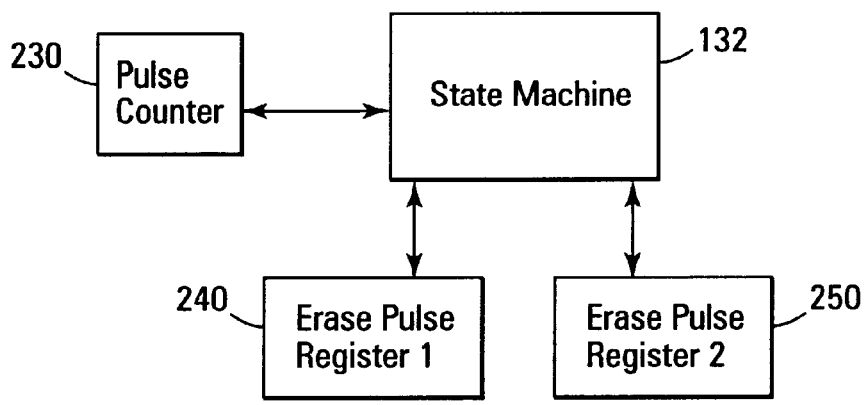
FIG. 5 is a block diagram of a pulse counter and erase register circuitry.

As explained above, the flash memory applies an initial erase pulse to the memory block prior to performing the verification operation. As explained above, during the verification operation additional erase pulses are applied to the memory block. It will be appreciated that a memory cell encountered early in the verification operation could result in numerous erase pulses being applied to the entire block. The present invention reduces the risk that a memory cell subjects the memory block to erases pulses that could result in over-erasure, by using programmable pulse registers. FIG. 5 illustrates state machine 132 coupled to a pulse counter 230. A first pulse register 240 and a second pulse register 250 are coupled to the state machine, and explained below.

The present invention provides non-volatile register 240 that can be programmed to instruct the memory to begin scan operations when a predetermined number of erase pulses have been applied to the memory block. For example, a statistical evaluation may indicate that X-pulses will erase a significant number of the memory cells. When the predetermined number of pulses (X) has been applied to the block during a verification operation, the memory begins the first scan operation. The register can be programmed based upon a statistical analysis of the memory device during fabrication. Likewise, the register can be modified after fabrication if the memory device characteristics change.

A memory device of the present invention can also include a second non-volatile register 250. The second register defines the number of erase pulses that are applied to the memory array sub-blocks that contain non-erased memory cells. As explained above, only sub-blocks that require additional erase pulses are subjected to additional erase pulses during verification operations. The second register is used to initiate subsequent scan operations when conducting the next verification operations of the sub-blocks. The contents of the register can be programmed based upon testing or statistical analysis, as explained above. The contents of the second register are compared to the pulse counter during verification operations. One skilled in the art with the benefit of the present disclosure will appreciate that additional registers, or processing circuitry, can be used to control the number of erase pulses between each verification operation. For example, it may be desired to apply up to X-erase pulses during the second erase verification operation, while less pulses (such as up to X−1) are desired during a third erase verification operation.

Figure 6:
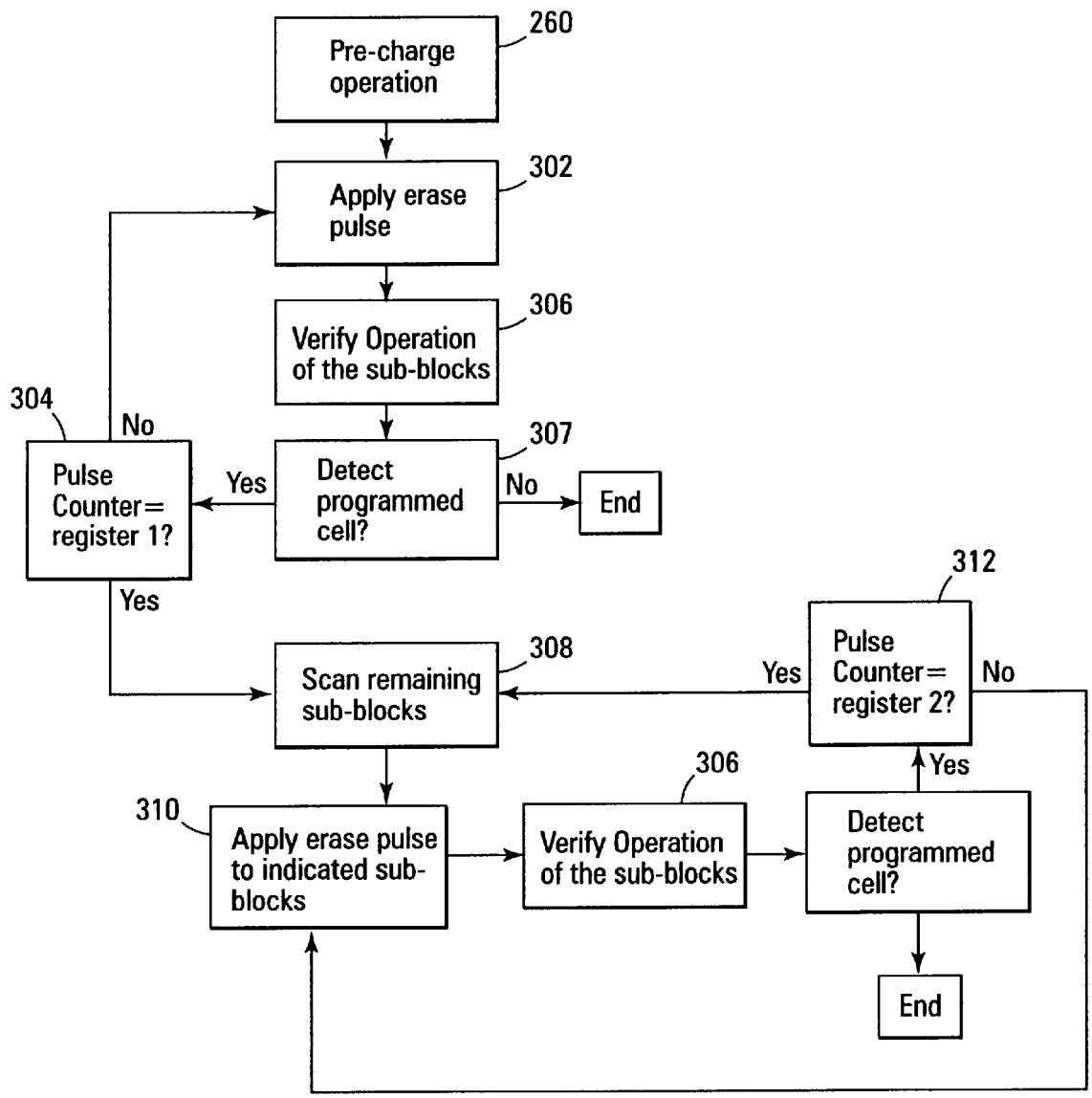
FIG. 6 is a flow chart of a more detailed erase operation of an embodiment of the present invention.
Figure 7:
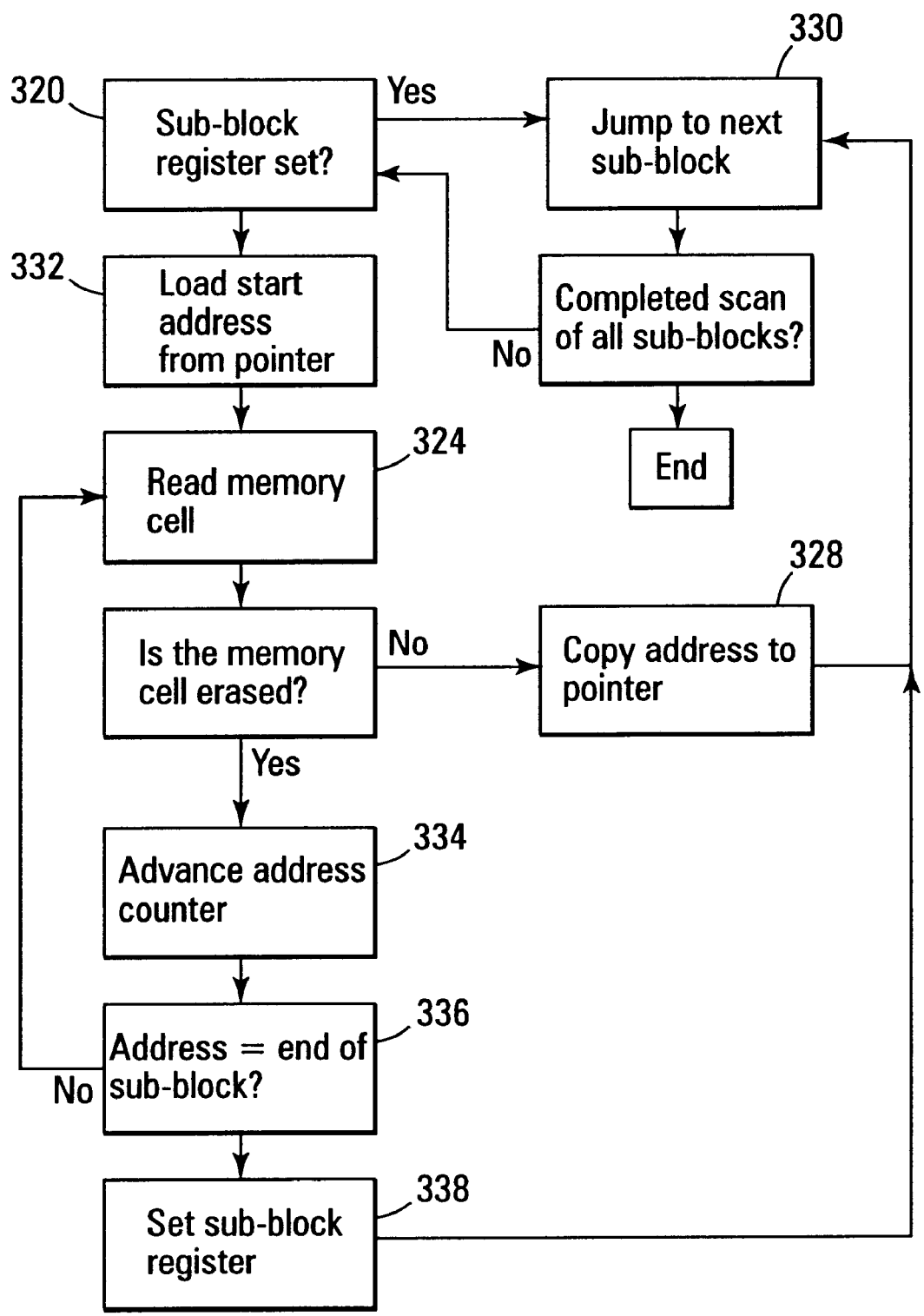
FIG. 7 is a detailed flow chart of a verification operation of an embodiment of the present invention.

Referring to FIG. 6, a flow chart of an erase and verification operation embodiment is described. The erase operation begins with a pre-charge operation (260) to charge all memory cells in a block of the memory array. After the pre-charge operation is complete, an erase pulse is applied to the memory cells in the block (302). A verification operation (306) is then performed on the memory block to determine if the memory cells have been erased. If a programmed memory cell is detected (307), the first pulse register 240 is compared to the pulse counter 230 (304). If the pulse count has not been reached, an additional erase pulse is applied to the and then the verification operation on the block is resumed by reading each memory cell in each sub-block (306). The scan operation is detailed below with reference to FIG. 7. If the pulse count is reached, the memory then begins a scan operation (308). The scan operation is used to read the memory cells in the sub-blocks to determine if the cells have been erased. If a programmed cell is read during scanning, additional erase pulses are not applied. The memory records the status of the sub-block and moves to the next sub-block to perform the scan. After the scan operation, the memory applies an erase pulse to the block that are contain a programmed cell (310). The memory then performs a verification operation on the sub-blocks that contained a programmed cell. Again, the subsequent verification operations begin at the last known programmed cell address. During the verification operation additional erase pulses may be needed. The erase pulse counter is compared to the second register (312). The scan operation is performed when the pulse threshold is reached. The verification and scan operations continue until the block is fully erased. FIG. 7 illustrates one embodiment of a scan operation 306. During the scan operation of the sub-blocks, the memory determines if the sub-block has its register set to indicate that all cells in the sub-block have been erased (320). If the sub-block is erased, the memory jumps to the next sub-block. If there are sub-blocks remaining to be scanned, the start address for the sub-block is loaded from the address pointer (322). The memory cell at the start address of the sub-block is read (324). If the memory cell is erased, the cell address is incremented (334) with the address counter if the address is not at the end of the block (336) and the next cell is read (324). If a programmed cell is detected, the cell address is copied from the address counter 220 into the verification address pointer for the sub-block (328). The memory then jumps to the next sub-block (330). If the memory reaches the end of the sub-block without detecting any programmed cells, the sub-block register 202 is set (338) and the next sub-block is scanned. The memory completes the scan operation when all sub-blocks have been scanned. Additional erase pulses may be required for all, or some of the sub-blocks, as described above.

Figure 8:
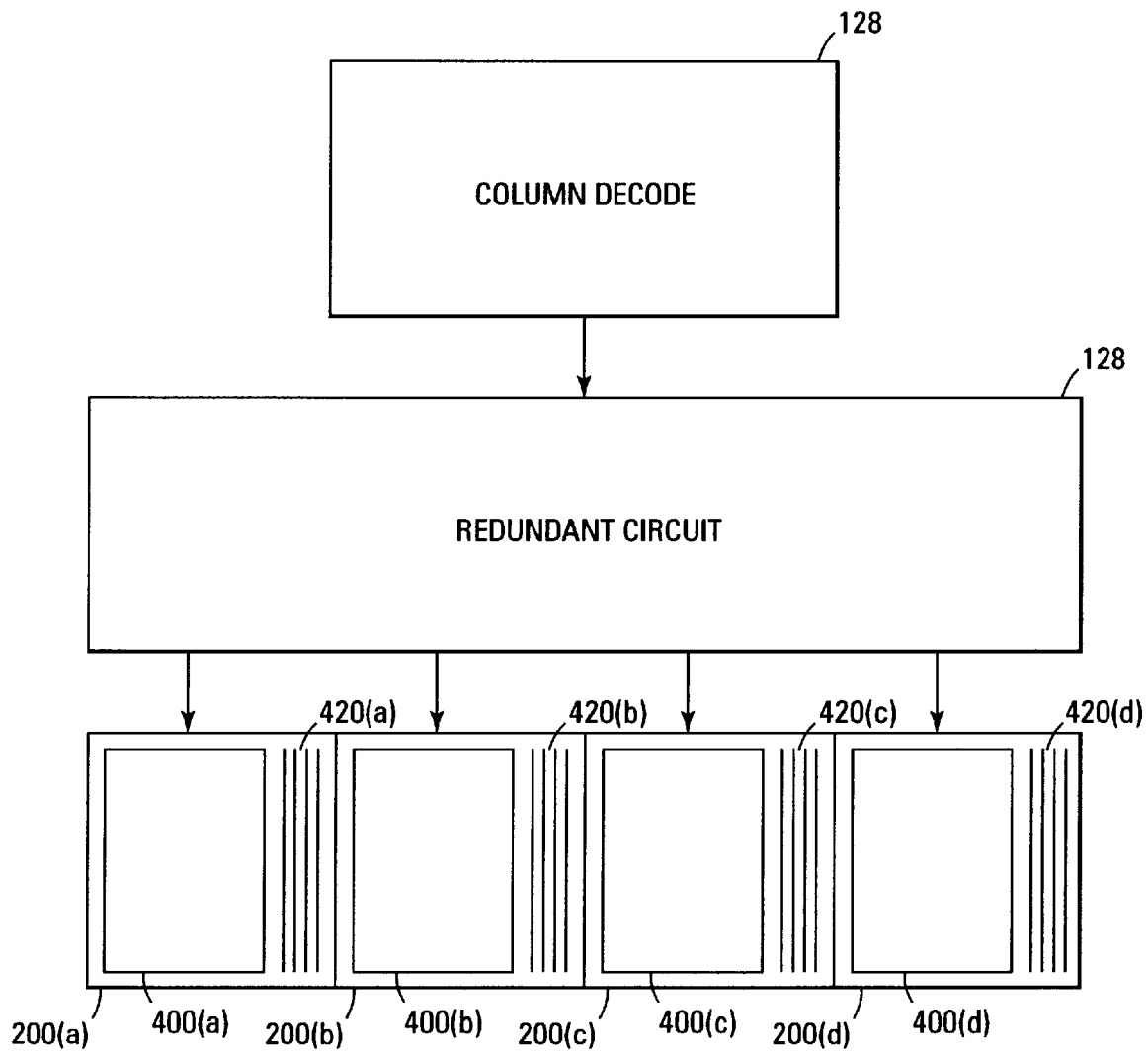
FIG. 8 is a block diagram illustrating redundant columns in sub-blocks of an embodiment of the present invention.

An embodiment of a redundant circuit 126 with redundant columns is illustrated in FIG. 8. As illustrated, the redundant circuit 126 is coupled between the column decode and the four sub-blocks 200(a)–(d) of the memory array block. Each time a column is addressed, the redundancy circuit compares the address request with addresses of defective columns stored in the redundant registers. Each redundant register is associated with a redundant column. When the redundancy circuit finds a matching address, it redirects the address request from the defective column to an associated redundant column.

In making the present invention efficient, redundant columns used to replace defective columns may be physically located in a different erasable block or sub-block than the defective column it replaces. This reduces the overall number of redundant columns needed in a memory array. FIG. 8 illustrates each sub-block 200(a)–(d) having primary locations 400(a)–(d) and redundant columns 420(a)–(d). If a sub-block has more defective columns than redundant columns, a redundant column or columns in another sub-block can be used to replace the excess number of defective columns. For example, if sub-block 200(a) has five defective columns, four of the defective columns can be replaced by the four redundant columns 420(a) in sub-block 200(a) and the fifth defective column can be replaced with one of the redundant columns 420(b) in sub-block 200(b). Although FIG. 8 illustrates four sub-blocks each having four redundant columns, it will be appreciated by those in the art, that the number of sub-blocks could vary as well as the number of redundant columns in each sub-block and the present invention is not limited to four sub-blocks with four redundant columns.

A problem can occur with the use of redundancy columns when a verification operation is being applied to a first sub-block that has a defective column mapped to an associated redundant column located in a second sub-block. The problem arises when the slowest bit or memory cell is located in the redundant column in the second sub-block. When the verification operation is applied to the first sub-block and memory cells in the defective column are addressed, the redundancy circuit redirects the address requests to the redundant column in the second sub-block. If the redundant column has a memory cell that is not fully erased, the sub-block register 202 for the first sub-block will be marked as a sub-block needing additional erase operations, even though the redundant column with the slow bit resides in the second sub-block. Moreover, since the redundant column is mapped to the defective column by the redundant circuit, an erase verification operation on the second sub-block will not verify the memory cells of the redundant column. If the remaining memory cells in the second sub-block are all in an erased state, the sub-block register 202 for the second sub-block will mark the second sub-block as not needing further erase operations, even though the memory cell that is not erased resides in the redundant column of the second sub-block. Thereafter, in response to the information stored in the sub-block registers, the first sub-block will receive an erase pulse or pulses while the second sub-block will not. In addition, this situation will be repeated over and over again since the memory cells in the redundant column in the second sub-block is not receiving the erase pulses. This will eventually cause the memory cells in the first sub-block to become over-erased.

In an embodiment of the present invention that incorporates redundant columns, verification of the redundant columns is done in a physical sense instead of a logical sense. That is, verification of redundant columns physically residing in a sub-block are verified with the data of the sub-block during erase verification. For example, if a verification operation is being applied to sub-block 200(a) and sub-block 200(a) has a defective column that is replaced with a redundant column in sub-block 200(b). The redundant column in sub-block 200(b) is not verified with sub-block 200(a). The redundant column in sub-block 200(b) is verified with the memory cells of sub-block 200(b). The respective sub-block register 204(a) or 204(b) is then set to indicate if its respective sub-block 200(a) or 200(b) is fully erased or needs additional erase operations.

In one embodiment, the state machine 131 or control circuitry disables a part of the redundancy circuit 126 that redirects address requests during an erase verification operation. Thereafter, memory cells coupled to a redundant column mapped to a first sub-block, but not physically located in the first sub-block, will be ignored during an erase verification operation on the first sub-block. Moreover, memory cells coupled to a redundant column physically located in a second sub-block that is mapped to the first sub-block, will be verified with the second sub-block. Therefore, during an erase verification of a sub-block, memory cells coupled to columns are verified based on the columns physical location in the sub-block.

CONCLUSION

A non-volatile memory device includes an array of erasable blocks of non-volatile memory cells. At least one of the blocks has at least one redundant column. A block register is associated with each erasable block. Each block register stores data that indicates when its associated erasable block is fully erased. A control circuit is used to perform an erase verification on each erasable block and provide data to the block registers based on an outcome of the erase verification. The control circuit performs the erase verification of the at least one redundant column in conjunction with the erasable block where the at least one redundant column resides.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A non-volatile memory device comprising:
   an array of erasable blocks of non-volatile memory cells, at least one of the blocks having at least one redundant column;
   a block register for each erasable block to store data to indicate when the erasable block is fully erased; and
   a control circuit to perform an erase verification on each erasable block and provide data to an associated block register based on an outcome of the erase verification, wherein the control circuit performs the erase verification of the at least one redundant column in conjunction with the erasable block where the at least one redundant column resides.

2. The non-volatile memory device of claim 1 further comprising a redundant circuit to redirect address requests from a defective column to a redundant column, wherein the redundancy circuit is disabled from redirecting address requests to redundant columns not residing in a same block of the array during the erase verification.

3. The non-volatile memory device of claim 2 wherein the control circuit disables the redundancy circuit.

4. A non-volatile flash memory device comprising:
   an array of non-volatile memory cells arranged in erasable blocks, wherein each erasable block comprises multiple sub-blocks;
   at least one of the sub-blocks includes a redundant column to selectively replace a defective column in one of the sub-blocks;
   a sub-block register for each sub-block to store a bit that indicates when the associated sub-block is either in an erased state or needs further erase; and
   a state machine to control memory operations, wherein the state machine performs individual erase verification operations on each sub-block including any redundant columns physically located in the sub-block and provides the bit to the associated sub-block register based on the outcome of the erase verification operation.

5. The non-volatile flash memory device of claim 4 wherein the multiple sub-blocks include a first sub-block and a second sub-block, the first sub-block having a defective column and the second sub-block having a redundant column to replace the defective column in the first sub-block, further wherein erase verification of the redundant column is performed with the erase verification of the second sub-block.

6. The non-volatile flash memory device of claim 5 wherein erase verification of the first sub-block does not include the redundant column in the second sub-block.

7. A non-volatile flash memory device comprising:
   an array of non-volatile memory cells arranged in erasable blocks, wherein each erasable block comprises multiple sub-blocks;
   at least one of the sub-blocks having multiple redundant columns to selectively replace defective columns in the sub-blocks;
   a sub-block register for each sub-block to store data to indicate when the associated sub-block is in an erased state; and
   a control circuit to control memory operations, wherein the control circuit performs individual erase verification operations on each sub-block in conjunction with any redundant rows physically located in the sub-block, further wherein the control circuit provides the data to the sub-block register based on the outcome of the erase verification operation on an associated sub-block.

8. The non-volatile memory device of claim 7 further comprising a redundant circuit to redirect address requests from defective columns in sub-blocks to redundant columns in sub-blocks, wherein the control circuit disables the redundancy circuit from redirecting address requests during an erase verification operation.

9. A non-volatile memory device comprising:
   an array of erasable blocks of non-volatile memory cells, at least one of the blocks having at least one redundant column;
   block registers associated with the erasable blocks, where each of the block registers store a bit that indicates when the erasable block is fully erased;
   address registers associated with the erasable blocks, where each of the address registers store a start verification address for its associated erasable block; and
   control circuitry to perform erase verification on each block and provide data to the block registers in response to an outcome of the erase verification on an associated block, wherein the control circuit starts an erase verification on each block at a start verification address of an associated address register and performs the erase verification of the at least one redundant column in conjunction with the block where the at least one redundant column resides.

10. The non-volatile memory device of claim 9 further comprising a redundancy circuit to redirect address requests from a defective column to the at least one redundant column, wherein the control circuitry disables the redundancy circuit from redirecting address requests from the defective column to the redundant column during an erase verification of a block.

11. The non-volatile memory device of claim 9 wherein the control circuitry begins verification of each block at a memory cell address equal to the block start verification address.

12. The non-volatile memory device of claim 9 further comprising an address counter, wherein contents of the address counter can be copied to the address registers and the start verification address stored in any of the address registers can be copied to the address counter.

13. A non-volatile flash memory system comprising:
a processor to provide an erase command;
a memory coupled to the processor comprising,
an array of non-volatile memory cells arranged in erasable blocks, wherein each erasable block comprises a plurality of sub-blocks, at least one of the sub-blocks having at least one redundant column,
a sub-block register for each sub-block to store a bit that indicates when the sub-block is fully erased,
a redundant circuit to redirect address requests from a defective column in a sub-block to the at least one redundant column, and
a control circuit to control erase operations in response to the erase command from the processor, wherein the control circuit disables the redundant circuit from redirecting address requests from a defective column in the sub-block to the at least one redundant column during an erase verification of an erase operation, further wherein the control circuit provides data to the sub-block register during an erase verification of a sub-block associated with the sub-block register.

14. The non-volatile flash memory system of claim 13 wherein the control circuit performs an erase verification of the at least one redundant column in conjunction with the sub-block where the at least one redundant column resides.

15. The non-volatile flash memory device of claim 13 wherein the control circuit performs an erase verification on each sub-block based on the physical location of the memory cells in the sub-block.

16. The non-volatile flash memory system of claim 13 wherein the bit the control circuit provides to a sub-block register indicates whether the sub-block is fully erased or needs further erase.

17. The non-volatile flash memory system of claim 16 wherein the control circuit performs erase operations on each erasable block based on a bit in an associated block register.

18. A method of performing an erase verify operation on an erasable block of flash memory cells, comprising:
verifying a state of each memory cell physically located in the block; and
ignoring a state of memory cells coupled to redundant columns mapped to the block but not physically located within the block.

19. The method of claim 18 wherein memory cells coupled to redundant columns physically located within the block is verified with the block.

20. The method of claim 18 wherein a redundant circuit that redirects address requests from defective columns in the block to the redundant columns outside the block are ignored during the erase verify operation.

21. A method of erase verify of an erasable sub-block of non-volatile memory cells comprising:
reading each memory cell in a primary sub-block of the sub-block of memory cells,
reading each memory cell coupled to redundant columns physically located in the sub-block of memory cells to verify the redundant columns and not verifying second redundant columns not physically located in the sub-block;
when all the memory cells are in an erased state, storing a bit in a sub-block register that indicates the sub-block is in an erased state; and
when a memory cell is read that is not in an erased state, storing a bit in the sub-block register that indicates the sub-block needs further erasure.

22. A method of erase verify 0f an erasable sub-block of non-volatile memory cells comprising:
reading each memory cell in a primary sub-block of the sub-block of memory cells;
reading each memory cell coupled to redundant columns physically located in the sub-block of memory cells;
when all the memory cells are in an erased state, storing a bit in a sub-block register that indicates the sub-block is in an erased state;
when a memory cell is read that is not in an erased state, storing the bit in a sub-block register that indicates the sub-block needs further erasure; and
ignoring the state of memory cells coupled to redundant columns mapped to the sub-block but not physically located in the sub-block.

23. A method of operating a flash memory comprising:
applying an erase pulse to an array of non-volatile memory cells arranged in erasable sub-blocks having redundant columns;
verifying each sub-block to determine if the memory cells located in each sub-block are in an erased state, wherein verification of each sub-block includes verification of memory cells coupled to redundant columns physically located in the sub-block and ignoring memory cells coupled to redundant columns mapped to the sub-block but located in another sub-block;
storing data in sub-block registers associated with each sub-block, wherein the bit stored in the sub-block register indicates whether the memory cells in an associated sub-block are in an erased state;
reading the bit in each sub-block register; and
applying further erase pulses to sub-blocks having a sub-block register with a bit that indicates the sub-block needs further erase.

24. The method of claim 23 wherein verifying if the memory cells in a sub-block are erased further comprises:
reading the memory cells in a primary sub-block of the sub-block; and
reading the memory cells in redundant columns physically located in the sub-block.

25. The method of claim 23 wherein verifying the erase of each memory cells further comprises:
disabling a redundant circuit from redirecting address requests from defective columns to redundant columns.

26. A method of erasing a flash memory comprising:
performing a pre-program operation on a block of memory cells;
applying an erase pulse to the block of memory cells;
performing a first erase verification operation on a first sub-block of the block of memory cells and on redundant columns physically located in the first sub-block while not performing erase verify on second redundant columns not physically located in the first sub-block; and
terminating the erase verification of the first sub-block.

27. A method of erasing a flash memory comprising:
performing a pre-program operation on a block of memory cells;
applying an erase pulse to the block of memory cells;
performing a first erase verification operation on a first sub-block of the block of memory cells and on redundant columns physically located in the first sub-block;

terminating the erase verification of the first sub-block; and disabling a redundant circuit from redirecting address requests from defective columns to redundant columns during the first erase verification operation.

28. A method of erasing a flash memory comprising:

performing a pre-program operation on a block of memory cells;

applying an erase pulse to the block of memory cells;

performing a first erase verification operation on a first sub-block of the block of memory cells and on redundant columns physically located in the first sub-block;

terminating the erase verification of the first sub-block;

performing an erase verification operation on a second sub-block of the block of memory cells and on redundant columns physically located in the second sub-block; and terminating the erase verification of the second sub-block.

29. The method of claim 28 further comprising:

disabling a redundant circuit from redirecting address requests from defective columns to redundant columns during the second erase verification operation.

30. A method of performing an erase operation on a non-volatile memory comprising:

applying a first erase pulse to a block of memory cells;

sequentially reading memory cells of a first sub-block of the block of memory cells, wherein the first sub-block includes memory cells coupled to redundant columns physically located in the first sub-block;

ignoring memory cells coupled to redundant columns mapped to the first-sub block but not physically located in the first sub-block;

storing an address of a first memory cell that is determined to be programmed in an address register;

applying a second erase pulse to the first sub-block of memory cells; and performing a second sequential reading of memory cells of the first sub-block starting at the first memory cell address.

31. The method of claim 30 further comprises sequentially reading memory cells of a second sub-block prior to applying the second erase pulse.

32. The method of claim 30 wherein the address of the first memory cell is loaded into an address counter prior to performing the second sequential reading.

* * * * *